US006850420B2

(12) United States Patent
Reiner

(10) Patent No.: US 6,850,420 B2

(45) Date of Patent: Feb. 1, 2005

(54) FLAT MOUNT WITH AT LEAST ONE SEMICONDUCTOR CHIP

(75) Inventor: Robert Reiner, Neubiberg (DE)

(73) Assignee: Infineon Technologies AG, Munich (DE)

(*) Notice: Subject to any disclaimer, the term of this patent is extended or adjusted under 35 U.S.C. 154(b) by 77 days.

(21) Appl. No.: 10/156,508

(22) Filed: May 28, 2002

(65) Prior Publication Data

US 2002/0172016 A1 Nov. 21, 2002

Related U.S. Application Data

(63) Continuation of application No. PCT/DE00/04139, filed on Nov. 23, 2000.

(30) Foreign Application Priority Data

Nov. 25, 1999 (EP) ............................................ 99123207

(51) Int. Cl.[7] .................................................. H05K 7/06

(52) U.S. Cl. ........................ 361/782; 361/737; 361/783; 257/679; 235/492

(58) Field of Search ................................ 361/734, 737, 361/738, 763, 766, 780, 782, 783, 793, 794, 811, 821; 257/679, 688; 235/488, 491, 492; 343/702, 872, 873; 340/572.7; 455/41.1

(56) References Cited

U.S. PATENT DOCUMENTS

| | | | | | |
|---|---|---|---|---|---|
| 3,967,161 | A | * | 6/1976 | Lichtblau | 361/765 |
| 4,656,478 | A | | 4/1987 | Leuenberger | 342/51 |
| 6,043,745 | A | * | 3/2000 | Lake | 340/572.1 |
| 6,111,506 | A | * | 8/2000 | Yap et al. | 340/572.1 |
| 6,563,425 | B2 | * | 5/2003 | Nicholson et al. | 340/572.7 |
| 6,622,921 | B2 | * | 9/2003 | Altwasser et al. | 235/492 |

FOREIGN PATENT DOCUMENTS

| | | |
|---|---|---|
| DE | 196 01 358 A1 | 7/1996 |
| EP | 0 019 191 A1 | 11/1980 |
| EP | 0 905 657 A1 | 3/1999 |
| RU | 2 097 881 | 11/1997 |

* cited by examiner

*Primary Examiner*—John B. Vigushin

(74) *Attorney, Agent, or Firm*—Laurence A. Greenberg; Werner H. Stemer; Gregory L. Mayback

(57) ABSTRACT

The flat mount assembly, or transponder, has at least one semiconductor chip that is connected to an antenna for interchanging data and power with an electronic apparatus. The antenna is formed of two electrical conductors. A conductive layer is formed on the mount in overlapping relationship with the electrical conductors of the antenna. The overlapping conductive layer results in greater capacitive coupling between the electronic apparatus and the flat mount assembly.

12 Claims, 4 Drawing Sheets

FLAT MOUNT WITH AT LEAST ONE SEMICONDUCTOR CHIP

CROSS-REFERENCE TO RELATED APPLICATION

This application is a continuation of copending International Application No. PCT/DE00/04139, filed Nov. 23, 2000, which designated the United States and which was not published in English.

BACKGROUND OF THE INVENTION

FIELD OF THE INVENTION

The invention relates to a flat mount having at least one semiconductor chip which is connected to an antenna for interchanging data and energy with an electronic apparatus, with the antenna comprising two electrical conductors.

Mounts such as these are referred to as passive transponders. The antenna, which is in the form of an electrical dipole, interchanges data and power with the electronic apparatus via a capacitive coupling. The power which can be transmitted from a capacitive antenna is limited by its coupling capacitance. The coupling capacitance is governed firstly by the distance between the capacitive antenna of the transponder and the antenna of the electronic apparatus, and secondly by the surface area of the capacitive antenna (of the transponder).

In order to achieve high coupling capacitance, the distance between the transponder and the electronic apparatus must be kept as small as possible. Alternatively or additively, the coupling capacitance also increases, the larger the surface area of the electrical antenna.

The surface area of the capacitive antenna is governed by the length and the width of the conductors that are used. It is thus limited firstly by the dimensions of the mount and secondly by the production method. If paper is used for the mount, then the antenna is introduced into the paper while the paper is being trimmed. With a production method such as this, the width of the antenna is relatively narrow, so that the surface area of the capacitive antenna is also correspondingly small.

An arrangement such as this, wherein paper is used as the mount and wherein the electrical antenna or the electrical dipole is aligned parallel to the shorter edge of the paper, is known from published European patent application EP 0 905 657 A1. In that specific exemplary embodiment, the paper is a currency note, with the semiconductor chip, in conjunction with the electrical dipole, representing a security element of the currency note. Such a mount, which is composed for example of paper, could also be used for security protection of objects in a department store. It is likewise known for such a mount to be used as the base in a smart card assembly.

Broadening of the electrical antenna in order to enlarge the antenna surface area and hence the coupling capacitance would result in a change to the production method. A step such as this is associated with extraordinary high costs.

SUMMARY OF THE INVENTION

It is accordingly an object of the invention to provide a flat support with at least one semiconductor chip, which overcomes the above-mentioned disadvantages of the heretofore-known devices and methods of this general type and which provides a transponder of the generic type, wherein the coupling between the capacitive antenna of the transponder and the electronic apparatus can be improved.

With the foregoing and other objects in view there is provided, in accordance with the invention, a flat mount assembly, comprising a flat mount, at least one semiconductor chip in or on the flat mount, an antenna formed of two electrical conductors connected to the at least one semiconductor chip for interchanging data and power with an electronic apparatus, and a conductive layer disposed on the mount and overlapping with the electrical conductors of the antenna.

According to the invention, the above objects are achieved in that a conductive layer is provided on the mount and overlaps the electrical conductors of the antenna. The coupling capacitance is in consequence increased by enlarging the effective surface area of the antenna for the electronic apparatus, by applying a broad conductive strip onto the mount. When the flat mount is made of paper, the strip can be applied on the surface of the paper.

Each of the two electrical conductors advantageously overlaps an associated conductive layer. The respective conductive layer in one particularly advantageous refinement in this case completely covers the respective electrical conductor. In order to ensure that the coupling between the transponder and the electronic apparatus is as good as possible, the surface area of the respective conductive layer is advantageously larger than that of the respective electrical conductor.

In an arrangement according to the prior art, the capacitance required for coupling is formed between the electrical conductors of the antenna of the transponder and the antenna of the electronic apparatus. As described in the introduction, the coupling capacitance is governed by the surface area and the distance between the two antennas.

The provision of a conductive layer on the mount, which overlaps the electrical conductors of the antenna of the transponder, results in the coupling capacitance being increased by connecting two capacitances, which are connected in series with one another, in parallel. The first capacitance is formed between the electrical conductors and the conductive layer. The coupling capacitance is in this case relatively large, so that the distance between the conductive layer and the electrical conductors of the antenna is very small. The distance is equal at most to the thickness of the mount, for example of a piece of paper. The second capacitance is formed by the conductive layer and the antenna of the electronic apparatus. Since the conductive layer has a large surface area, this results in a high level of coupling to the electronic apparatus. The coupling between the electrical conductors of the antenna and the antenna of the electrical apparatus is admittedly reduced, since the conductive layer is equivalent to shielding. However, this reduction does result in any problems, since the coupling capacitance is increased considerably by connecting the series circuit formed by the first and second capacitances in parallel.

The conductive layer advantageously makes direct electrical contact with the electrical conductors. This simply means that the first capacitance of the parallel circuit assumes its maximum value. An arrangement such as this can be achieved by applying the conductive layer directly onto that face of the mount on which the electrical conductors of the antenna of the transponder are provided.

In accordance with an added feature of the invention, the conductive layer is located at a distance from the electrical conductors by way of a dielectric. The dielectric may then, for example, be the mount itself. This simply means that the conductive layer and the electrical conductors of the antenna are provided on the opposite large-area faces of the mount.

In accordance with an additional feature of the invention, the electrical conductors of the antenna are embedded together with the semiconductor chip in the mount. This ensures that the electrical conductors and the semiconductor chip are protected against mechanical damage.

In accordance with an advantageous refinement of the invention, the conductive layer is arranged with mirror-image symmetry with respect to the electrical conductors. The conductive layer is advantageously printed on the mount, and may therefore have a relatively high impedance. This results in there being supply line impedances between the first and the second capacitance. However, the supply line impedances can be kept small by arranging the conductive layer symmetrically with respect to the electrical conductors.

In accordance with a further feature of the invention, the electrical conductors are arranged symmetrically with respect to the semiconductor chip. This simply means that the electrical dipole has two identical electrical conductors.

In accordance with a concomitant feature of the invention, the semiconductor chip is located outside the mirror-image axes of the flat mount. Specifically, if the flat mount is flexible and bendable, then it is frequently folded. It has been found in practice that folding generally occurs on the center axis of the mount. If the semiconductor chip is now placed on one of these center axes of the flat mount, then it is not damaged by the folding process. The arrangement of the semiconductor chip outside the mirror-image axes or center axes of the mount prevents damage, and thus prevents interference with the operation of the entire arrangement.

Other features which are considered as characteristic for the invention are set forth in the appended claims.

Although the invention is illustrated and described herein as embodied in a flat mount with at least one semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
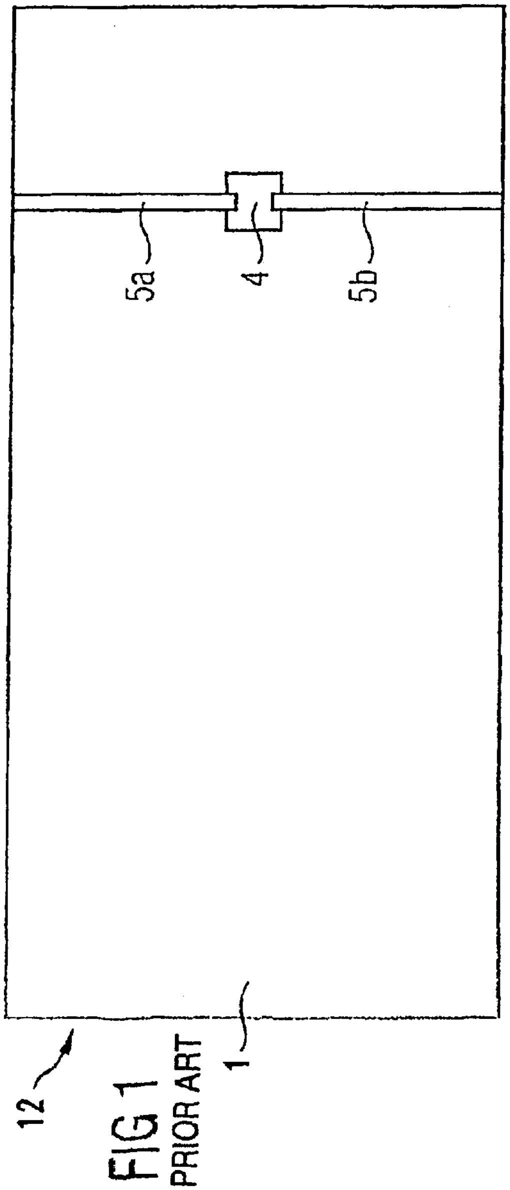
FIG 1 PRIOR ART
FIG. 1 is a plan view of a flat mount as it is known from the prior art.

Referring now to the figures of the drawing in detail and first, particularly, to FIG. 1 thereof, there is shown a plan view of a transponder 12 of the generic type. The transponder 12 has a mount 1. The antenna is arranged parallel to one of the short side edges, and comprises a first electrical conductor 5*a* and a second electrical conductor 5*b*. The electrical conductors 5*a*, 5*b* are each electrically and mechanically connected at one end to a semiconductor chip 4. The electrical conductors 5*a*, 5*b* form a dipole. In the exemplary embodiment, the mount 1 is rectangular in shape. The dimensions of the mount 1 are, however, not restricted to this geometrical configuration. The mount 1 could just as well be round, oval, square, etc.

Figure 2C:
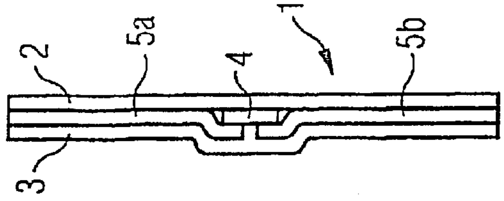
FIG 2C PRIOR ART
FIGS. 2A to 2C show respective cross sections of different embodiments of the flat mount of FIG. 1.
Figure 2A:
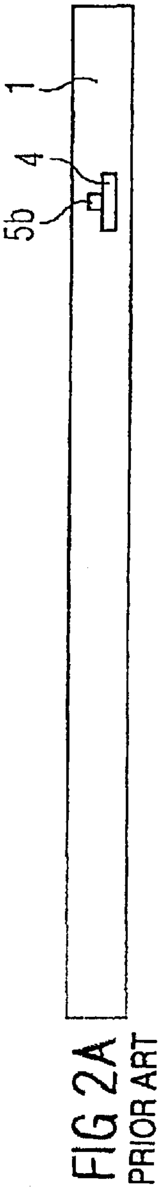
FIG 2A PRIOR ART
Figure 2B:
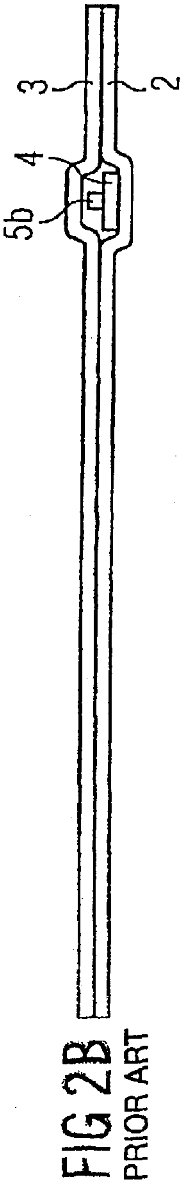
FIG 2B PRIOR ART

As can be seen from FIGS. 2A to 2C, the mount 1 is flat in shape. FIGS. 2A to 2C show different refinement options, illustrating how the electrical conductors 5*a*, 5*b* can be arranged together with the semiconductor chip 4 in the flat mount 1.

In FIG. 2A, the electrical conductors 5*a*, 5*b* are incorporated in the mount 1 together with the semiconductor chip 4. The mount 1 could, for example, be composed of a plastic, wherein the antenna is embedded together with the semiconductor chip 4.

In FIG. 2B, the mount 1 comprises a sandwich of a first layer 2 and a second layer 3, which are arranged one above the other. The electrical conductors 5*a*, 5*b* are arranged together with the semiconductor chip between the first layer 2 and the second layer 3. The mount then has a slightly raised area at the point of the electrical conductors and of the semiconductor chip. If the layer thicknesses of the first layer 2 and of the second layer 3 are thick in comparison to the dimensions of the electrical conductors 5*a*, 5*b* and the semiconductor chip 4, then the raised area projects only slightly beyond the main surfaces of the mount.

FIG. 2C shows a cross section through the short side edge of the transponder which is known from FIG. 1. As in FIG. 2B, the mount 1 comprises a first layer 2 and a second layer 3, between which the assembly comprising the electrical conductors 5*a*, 5*b* and the semiconductor chip 4 is arranged. It can be seen from FIG. 2C that the first and the second electrical conductors 5*a*, 5*b* are not electrically conductively connected to one another. That end of each of the electrical conductors 5*a*, 5*b* which faces the interior of the mount is in each case connected to an electrical contact on the semiconductor chip 4. Those ends of the electrical conductors 5*a*, 5*b* which face outward extend, in the present exemplary embodiment, as far as the side edges of the mount 1.

The electrical coupling between the transponder 12 and an electronic apparatus is governed firstly by the distance between the transponder and the electronic apparatus and secondly by the surface area of the antenna, formed from the electrical conductors 5*a*, 5*b*. The surface area of the antenna is thus governed by the width of the electrical conductor, which is normally predetermined by the production method, and the length, which is determined by the dimensions of the mount 1. Good capacitive coupling between the transponder 12 and the electronic apparatus is thus achieved only providing the separation does not exceed a specific value.

Figure 3:
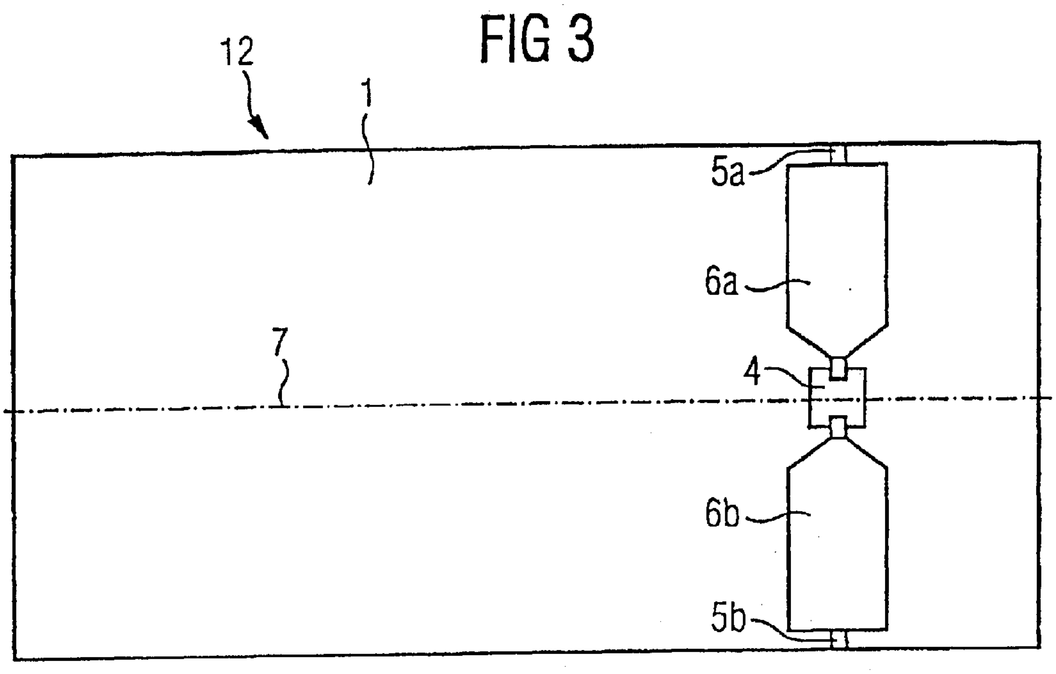
FIG. 3 is a plan view of a first exemplary embodiment of a flat mount according to the invention.

This disadvantage can be circumvented by way of the present invention. FIG. 3 shows a plan view of a first exemplary embodiment of the invention. The transponder 12 once again has a flat mount 1 which has an antenna, comprising the electrical conductors 5*a*, 5*b*, aligned parallel to the short side edges of the mount 1. In order to increase the capacitive coupling, an electrically conductive layer 6*a*, 6*b* is now applied to a first main face 9. Two conductive layers 6*a*, 6*b*, which each have an associated electrical conductor 5*a*, 5*b*, are provided in a corresponding manner to the configuration of the antenna formed by the electrical conductors 5*a*, 5*b*. The conductive layers 6*a*, 6*b* are in this case arranged such that they overlap the electrical conductors 5*a*, 5*b*. As can be seen from FIG. 3, the conductive layers 6*a*, 6*b* are arranged symmetrically around the electrical conductors 5*a*, 5*b*. In FIG. 3, the electrical conductors 5*a*, 5*b* are not overlapped completely by the conductive layers 6*a*, 6*b*. This is also unnecessary, provided the electrically conductive layers 6*a*, 6*b* have a suitably large surface area.

Figure 5:
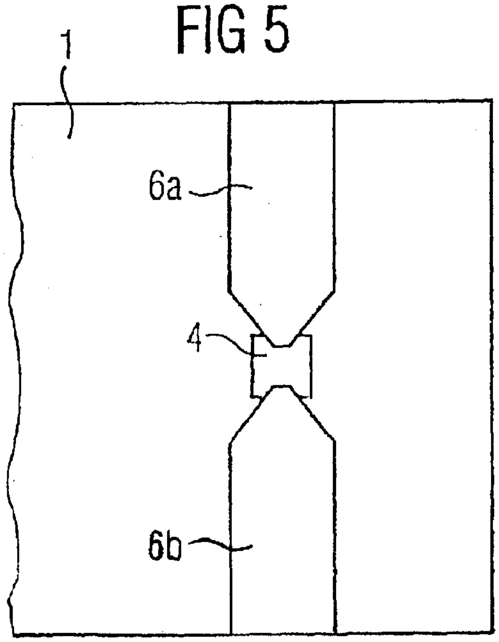
FIG. 5 is a plan view of a second exemplary embodiment of the flat mount according to the invention.

In contrast to this, FIG. 5 shows a second exemplary embodiment, wherein the conductive layers 6*a*, 6*b* completely cover the electrical conductors 5*a*, 5*b*.

The high-impedance layers can be printed on the mount 1. They are advantageously applied such that they are colorless and transparent, so that they do not interfere with the appearance of the mount 1. Since the flat mount is generally also printed in the prior art, in order, for example, to apply a company logo, a number or an image, nothing must be changed in the manufacturing method, since the printing process for the high-impedance layers can be carried out together with the printing of the surface.

Figure 4A:
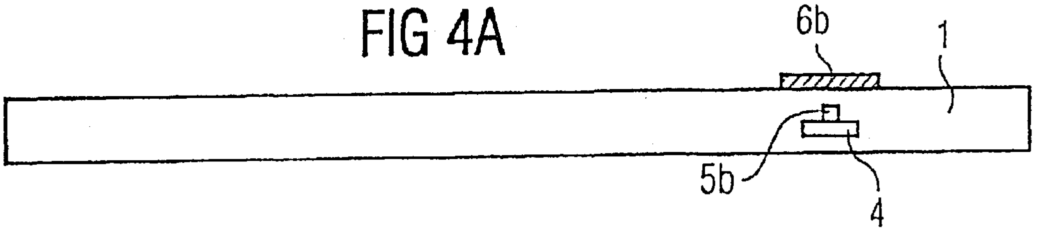
FIGS. 4A to 4D show respective cross sections of different embodiments of the flat mount illustrated in FIG. 3.

FIGS. 4A to 4D each show a cross section of various exemplary embodiments of the flat mount according to the invention. In FIG. 4A, the flat mount 1 is formed, for example, from a plastic, in whose interior the semiconductor chip 4 and the electrical conductors 5*a*, 5*b* are incorporated. The electrically conductive layers 6*a*, 6*b* are applied to the first main face 9 of the flat mount 1. It can be seen from this illustration that the conductive layers 6*a*, 6*b* and the electrical conductors 5*a*, 5*b* overlap one another. The electrical conductors 5*a*, 5*b* and the conductive layers are arranged at a distance from one another. The flat mount 1 thus represents a dielectric between the two "electrodes" of the capacitance which is formed from the electrical conductor and the conductive layer. Since the distance between the conductive layer and the electrical conductor is, however, very small, this results in a high level of coupling capacitance.

Figure 4B:
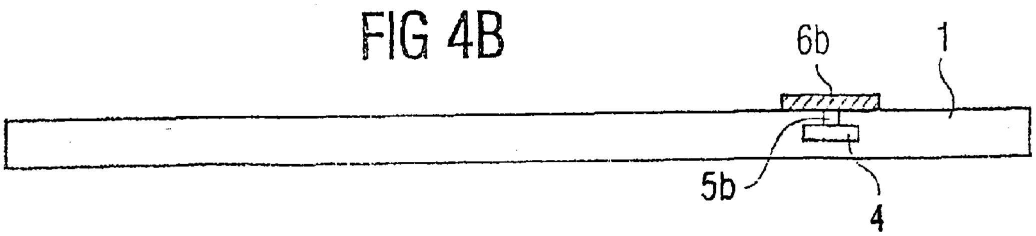
Figure 4C:
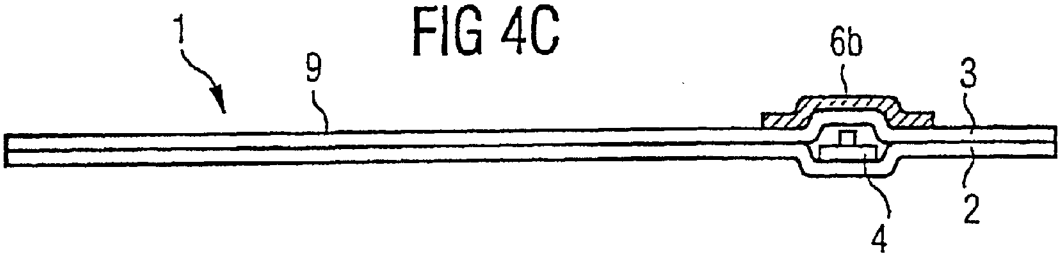

The coupling capacitance can be further increased by, as shown in FIG. 4B, the electrical conductors 5*a*, 5*b* extending as far as the first main face 9. In this case, the electrically conductive layers 6*a*, 6*b* can be brought into direct electrical contact with the electrical conductors 5*a*, 5*b*. This results in the maximum coupling. The flat mount 1 can also, as is shown in FIG. 4C, comprise a first layer 2 and a second layer 3, between which the arrangement comprising the semiconductor chip 4 and the electrical conductors 5*a*, 5*b* is located. The electrically conductive layer 6, 6*b* is then once again arranged on the first main face 9 of the flat mount 1.

Figure 4D:
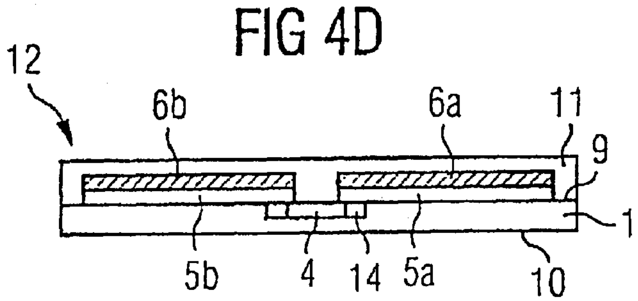

FIG. 4D shows a cross section through the short face of the transponder 12 of a further exemplary embodiment of the arrangement according to the invention. The flat mount 1 is composed, for example, of plastic, on whose first main face 9 a recess 14 is provided. The semiconductor chip 4 is introduced into this recess 14. The electrical conductors 5*a*, 5*b* are located on the first main face 9 of the mount 1, and the electrically conductive layers 6*a*, 6*b* made direct contact with them. These conductive layers in this case completely overlap the electrical conductors 5*a*, 5*b*. For protection against mechanical damage, the transponder 12 has a covering layer 11, which is applied over the arrangement comprising conductive layer, the electrical conductor and the semiconductor chip 4.

Figure 6:
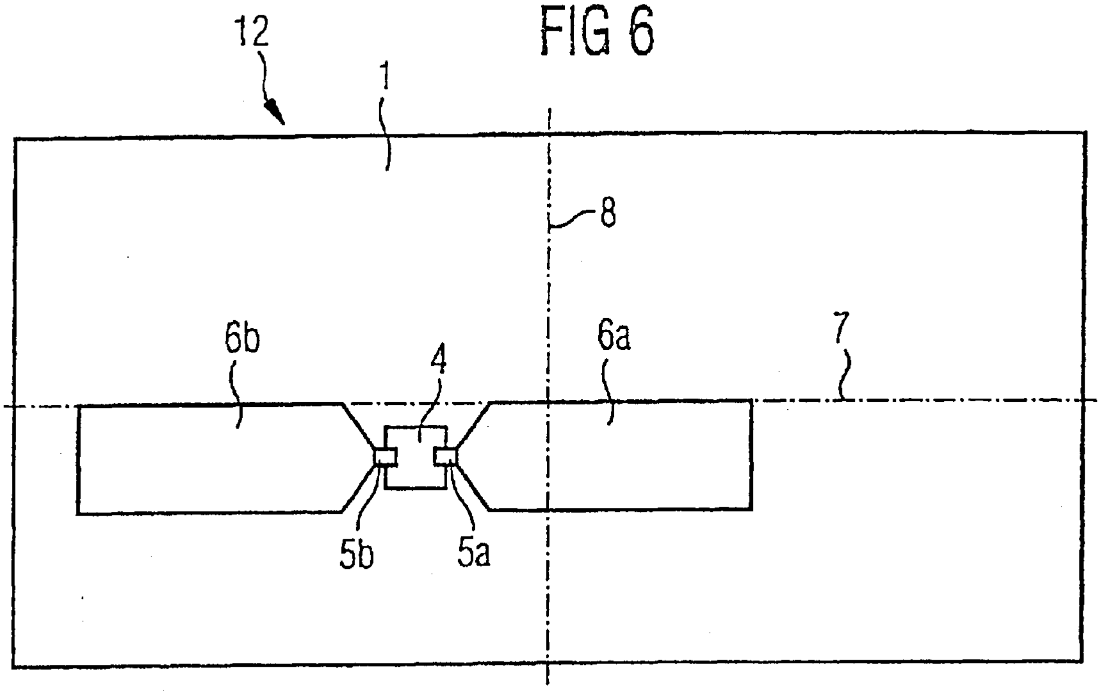
FIG. 6 is a plan view of a third exemplary embodiment of the flat mount according to the invention.

FIG. 6 shows a third exemplary embodiment, which differs from the previous exemplary embodiments only in that the arrangement comprising the semiconductor chip, the electrical conductors 5*a*, 5*b* and the conductive layers 6*a*, 6*b* are arranged on the flat mount 1 such that the semiconductor chip 4 is not located on the axes of symmetry 7 and 8. This ensures that it is possible to prevent damage to the semiconductor resulting from bending or folding of the flat mount, which is preferably composed of paper.

Figure 7:
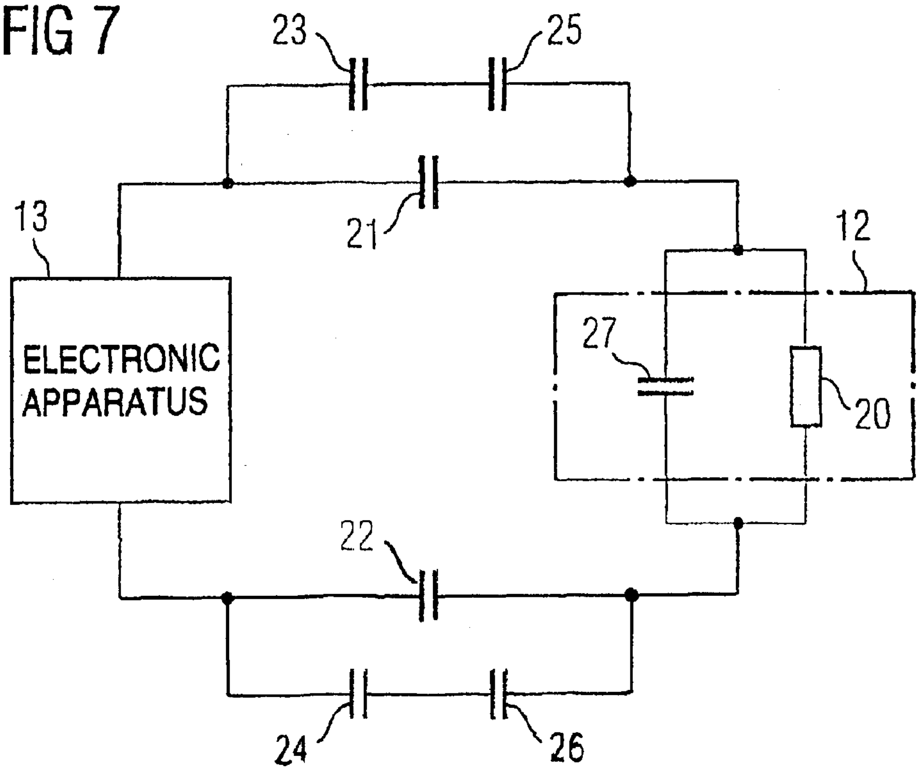
FIG. 7 is an electrical equivalent circuit of the capacitive coupling between a transponder and an electronic apparatus.

The method of operation will be described in more detail with reference to FIG. 7, which illustrates an electrical equivalent circuit of the assembly according to the invention comprising the transponder 12 and an electronic apparatus 13. In simplified form, an electrical equivalent circuit of the transponder 12 comprises a parallel circuit formed from a capacitance 27 and a resistor 20. Data and energy are interchanged capactively between the transponder 12 and the electronic apparatus 13, which is not shown in any more detail in the present equivalent circuit. Numerals 21 and 22 in this case denote capacitances, which are formed between the antenna of the electronic apparatus 13 and the electrical conductors 5*a*, 5*b*, which form the electrical dipole of the transponder 12. Numerals 23 and 24 denote the capacitances between the antenna of the electronic apparatus 13 and the printed conductive layers 6*a*, 6*b*. The reference symbols 25 and 26 denote the capacitances between the conductive layers 6*a*, 6*b* and the electrical conductors 5*a*, 5*b* of the transponder 12. The capacitances 23, 25 are in this case connected in parallel with the capacitance 21. The capacitances 24 and 26 are connected to the capacitance 22 in a corresponding manner. The shielding effect of the printed conductive layers 6*a*, 6*b* admittedly reduces the capacitances 21, 22. However, this reduction is far more than compensated for by the additional capacitances 23, 25 and 24, 26. The capacitances 23, 24, which are formed between the antenna of the electrical apparatus 13 and the conductive layers 6*a*, 6*b*, are relatively large owing to the large surface area of the conductive layer. The capacitances 25 and 26 between the conductive layers and the electrical conductors are also large, since the distance between the conductive layer and the respective electrical conductors 5*a*, 5*b* is very small. As a maximum, the separation is equal to half the thickness of the mount 1.

The invention thus makes it possible to provide, in a simple and cost-effective manner, a transponder that has a considerably greater coupling capacitance than the prior art. It is thus also possible to operate the transponder at greater distances.

I claim:

1. A flat mount assembly, comprising a flat mount, at least one semiconductor chip in or on said flat mount, an antenna formed of two electrical conductors connected to said at least one semiconductor chip for interchanging data and power with an electronic apparatus, and a conductive layer disposed on said mount and overlapping said electrical conductors of said antenna for improving a capacitive coupling between said antenna and the electronic apparatus.

2. The flat mount assembly according to claim 1, wherein each of said two electrical conductors overlaps with an associated said conductive layer.

3. The flat mount assembly according to claim 2, wherein a respective said conductive layer completely covers a respective said electrical conductor.

4. The flat mount assembly according to claim 1, which further comprises a dielectric, and wherein said conductive layer is located at a distance from said electrical conductors, separated by said dielectric.

5. The flat mount assembly according to claim l, wherein said electrical conductors are embedded together with said semiconductor chip in said flat mount.

6. The flat mount assembly according to claim 1, wherein said flat mount has a first main face and said electrical conductors are applied on said first main face.

7. The flat mount assembly according to claim 1, wherein said conductive layer is in direct electrical contact with said electrical conductors.

8. The flat mount assembly according to claim 1, wherein said conductive layer is arranged mirror-symmetrically with respect to said electrical conductors.

9. The flat mount assembly according to claim 1, wherein said electrical conductors are arranged symmetrically with respect to said semiconductor chip.

10. The flat mount assembly according to claim 1, wherein said semiconductor chip is disposed outside a mirror-image axis of said flat mount.

11. The flat mount assembly according to claim 1, wherein said flat mount is composed of paper.

12. The flat mount assembly according to claim 1, wherein a surface area of a respective said conductive layer is greater than a surface area of a respective said electrical conductor.

* * * * *